US008229175B2

United States Patent
Tang (10) Patent No.: US 8,229,175 B2
(45) Date of Patent: Jul. 24, 2012

(54) SYSTEM AND METHOD FOR QUALITY CHECKING OF ANISOTROPIC CONDUCTIVE FILM

(75) Inventor: Pei-Chong Tang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 850 days.

(21) Appl. No.: 12/353,983

(22) Filed: Jan. 15, 2009

(65) Prior Publication Data

US 2009/0219532 A1  Sep. 3, 2009

(30) Foreign Application Priority Data

Feb. 29, 2008 (CN) .......................... 2008 1 0300432

(51) Int. Cl.
*G06K 9/00* (2006.01)
*H01L 21/00* (2006.01)
(52) U.S. Cl. .............................. 382/112; 382/144; 438/7
(58) Field of Classification Search .................. 382/100, 382/103, 108, 141, 144, 145–154, 162, 168, 382/173, 181, 199, 232, 254, 260, 274–276, 382/283–295, 305, 312, 112; 257/59; 156/272.2, 156/274; 349/187; 264/429; 252/513; 438/7
See application file for complete search history.

(56) References Cited

U.S. PATENT DOCUMENTS

| | | | | |
|---|---|---|---|---|
| 5,858,806 A * | 1/1999 | Nishida | ............................. | 438/7 |
| 6,149,857 A * | 11/2000 | McArdle et al. | ............... | 264/429 |
| 6,402,876 B1 * | 6/2002 | McArdle et al. | ............... | 156/247 |
| 6,627,118 B2 * | 9/2003 | Kageyama et al. | ........... | 252/513 |
| 6,885,426 B2 * | 4/2005 | Matsui et al. | .................. | 349/187 |
| 6,977,025 B2 * | 12/2005 | McArdle et al. | ........... | 156/272.2 |
| 7,411,211 B1 * | 8/2008 | Yamazaki | ....................... | 257/59 |

* cited by examiner

*Primary Examiner* — Seyed Azarian
(74) *Attorney, Agent, or Firm* — Altis Law Group, Inc.

(57) ABSTRACT

An exemplary system for calculating the number of conductive particles dispersed in an anisotropic conductive film includes an image capturing device and an image processing device. The image capturing device captures a color image of the anisotropic conductive film. The image processing device processes the color image to generate a first binary image. The second binary image includes a plurality of first objects. The first objects occupy a first area in the first binary image. The image processing device processes the first binary image to generate a second binary image having different size with respect to the first binary image by a predetermined value. The second binary image includes a plurality of second objects. The second objects occupy a second area in the second binary image. The image processing device calculates a number of the conductive particles according to the first area, the second area, and the predetermined value.

18 Claims, 6 Drawing Sheets

SYSTEM AND METHOD FOR QUALITY CHECKING OF ANISOTROPIC CONDUCTIVE FILM

BACKGROUND

1. Field of the Invention

The present disclosure relates to systems and methods for checking anisotropic conductive film (ACF), and particularly to a system and method for checking the quality of the ACF by calculating the number of conductive particles dispersed in ACF.

2. Description of Related Art

Generally, to connect or bond driver integrated circuits (ICs) chips to flat panel displays, ACFs are used. The ACF may be a hybrid conductive film including a suitable binder and conductive particles. The conductive particles are dispersed in the binder for establishing electrical connection between the driver ICs chips and the flat panel displays such as liquid crystal display (LCD).

In manufacturing, it is important to determine the quality of the ACF being produced. Conventionally, the quality is determined by measuring the electrical resistance of the ACF. However, because of electrical noise during the measuring process, the precision of the results is compromised.

Therefore, a system and method are needed in the industry to address the aforementioned deficiency.

DETAILED DESCRIPTION

In general, the present disclosure employs an optical inspection method, instead of an electrical inspection method, and a system arranged correspondingly to determine a quality of an anisotropic conductive film (ACF). In particular, the method and system are directed to calculate the number of conductive particles dispersed in the ACF using an image processing technology. More details will be described hereinafter.

Figure 1:
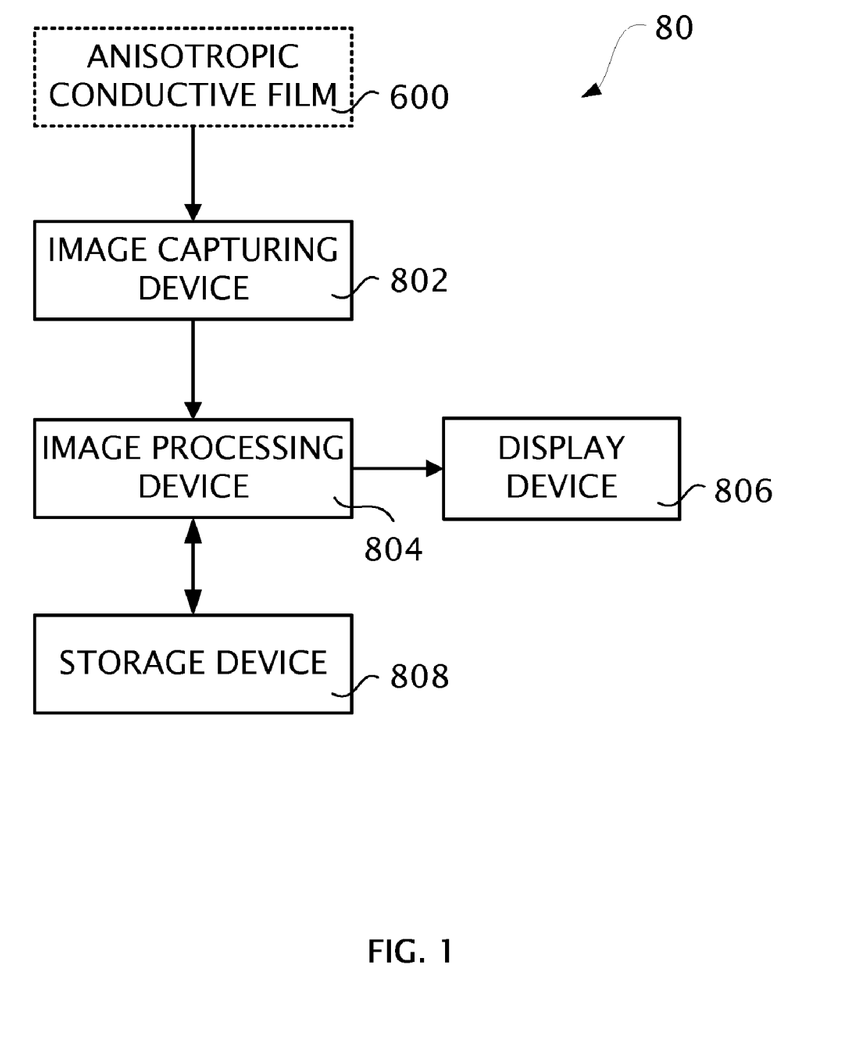
FIG. 1 is a block diagram of a system for calculating the number of conductive particles dispersed in an anisotropic conductive film in accordance with an exemplary embodiment.

Referring to FIG. 1, a simplified block diagram of a system 80 in accordance with an exemplary embodiment is illustrated. The system 80 is arranged for analyzing an image of conductive particles dispersed in an ACF 600, and calculating the number of conductive particles. By calculating the number of conductive particles, the quality of the ACF 600 can be determined accordingly. The conductive particles may be made of gold, silver, or other metal-coated polymer having diameters ranging from 5-20 µm. Typically, the conductive particles are mixed with other binder such as epoxy resin to form the ACF 600. The system 80 generally includes an image capturing device 802, an image processing device 804, a display device 806, and a storage device 808.

The image capturing device 802 may be a video camera configured for capturing images originating from ACF 600, and convert the images to corresponding electrical signals.

The image processing device 804 is electrically coupled to the image capturing device 802 for receiving the electrical signals. The image processing device 804 is configured for processing the electrical signals and send the signals to the display device 806 to display a corresponding image of the ACF 600. The image processing device 804 is further configured to format the electrical signals to store the image in the storage device 808.

Figure 2A:
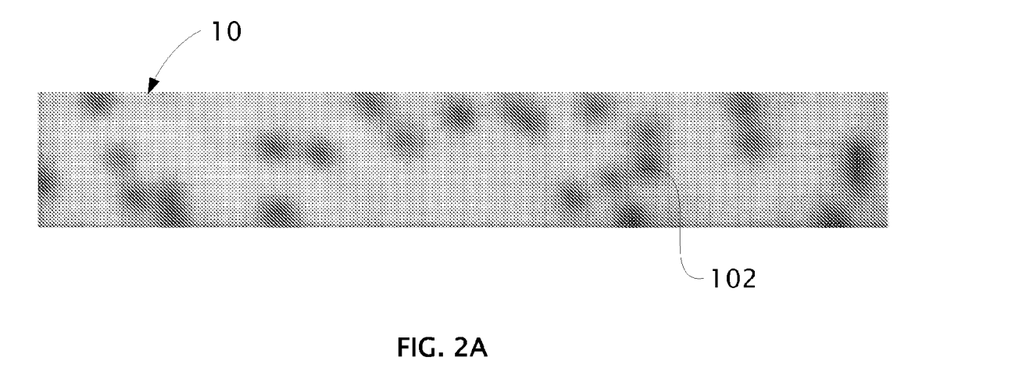
FIG. 2A is an original image of the anisotropic conductive film, captured by an image capturing device, of the system of FIG. 1.

Referring to FIG. 2A, an original image 10 of the ACF 600 is illustrated, which includes a plurality of dark objects 102 irregularly distributed in the ACF. Also referring to FIG. 2B, a first binary image 20 is illustrated. In order to calculate the number of the conductive particles dispersed in the ACF 600, the image processing device 802 processes the color image 10 to generate the first binary image 20. The image processing device 802 further converts the first binary image 20 to a second binary image 30 (referring to FIG. 2C) which is a reduced version of the first binary image 20. The image processing device 802 may send the original image 10, the first binary image 20, and the second binary image 30, to the display device 806, to be displayed.

Figure 2B:
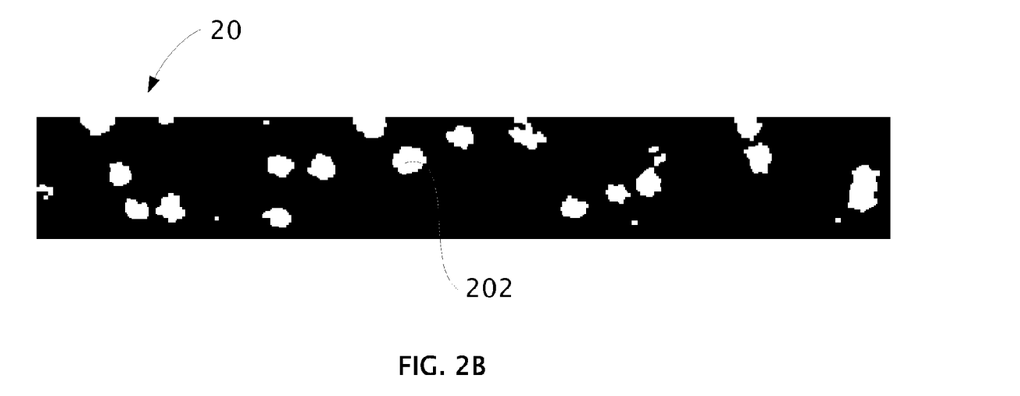
FIG. 2B is a first binary image processed from the color image of the ACF of FIG. 2A.
Figure 2C:
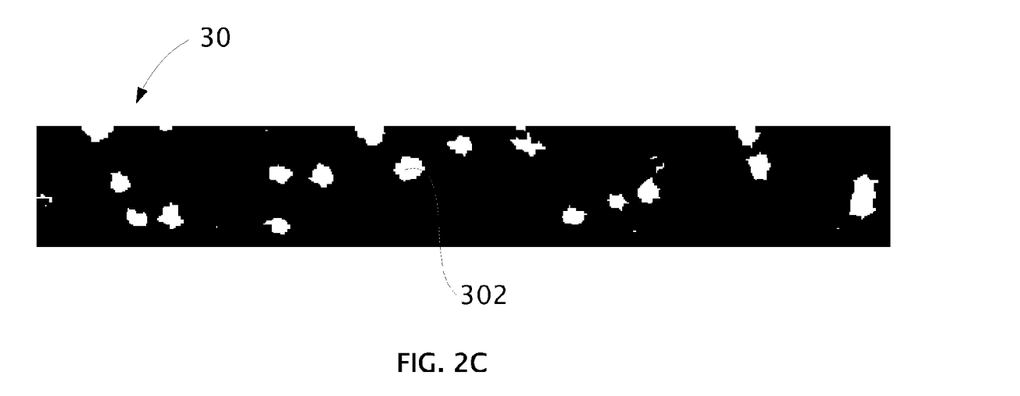
FIG. 2C is a second binary image similar to the first binary image but reduced in size.

As used here, a "binary image" is a digital image that has only two pixel values of 0 and 1. The binary image 20 is created by setting pixels corresponding to the dark areas of the original image 10 to 0 and the light areas to 1. As shown in FIG. 2B, the binary image 20 is essentially a black and white negative of the color image 10 having a plurality of first white objects 202 in a black background. The white objects 202 correspond to conductive particles dispersed in the ACF 600. As shown in FIG. 2C, the second binary image 30 is smaller than the first binary image 20, having a plurality of second white objects 302 in a black background. Each of the second white objects 302 corresponds to one of the white objects 202 but is reduced in size.

Figure 3:
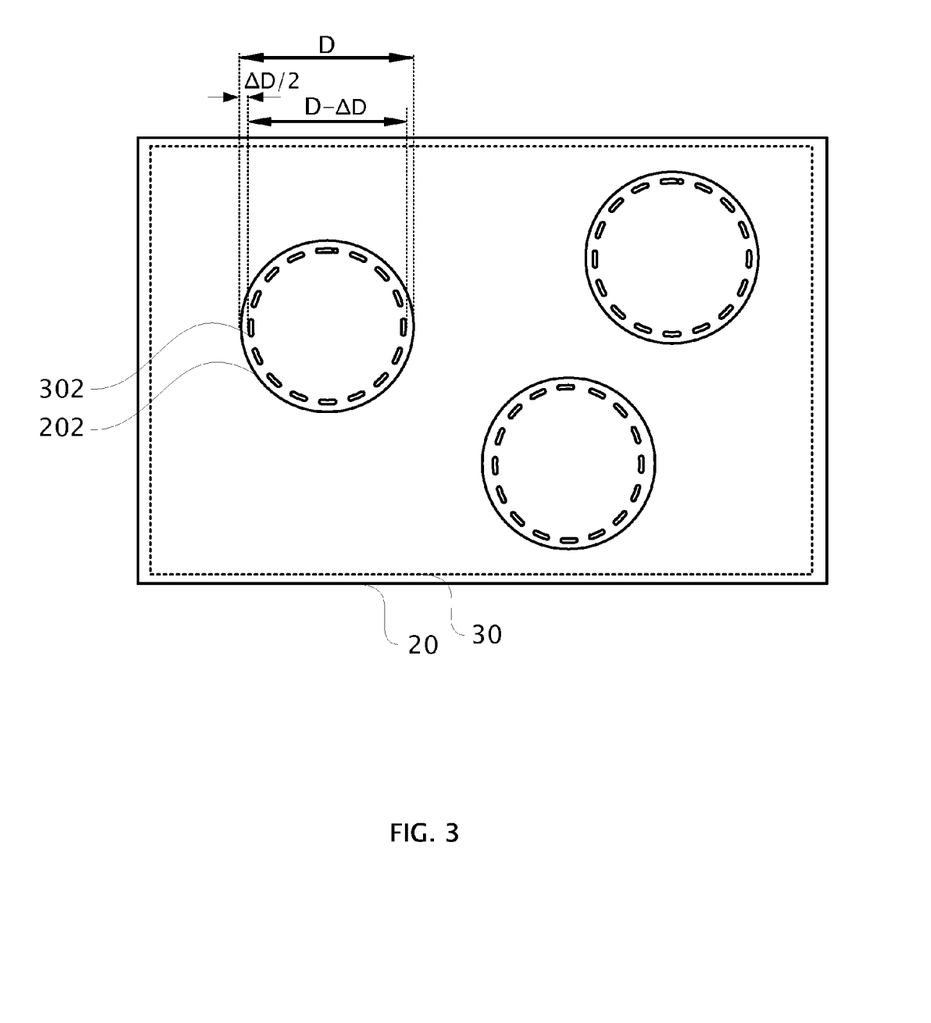
FIG. 3 is a schematic view illustrating a first type of conductive particles in the ACF.

Referring to FIG. 3, in a first embodiment, the first white objects 202 and second white objects 302 are generally circular. The first white objects 202 and second white objects 302 represent the conductive particles that are globular. As shown in FIG. 3, the first white objects 202 have an average diameter of D, and the second white objects 302 have an average diameter of D−ΔD, where Δ is the percent of reduction from the first binary image 20 to the second binary image 30. Assume the number of the conductive particles to be determined is M. A first area S0 occupied by the first white objects 202 and a second area S1 occupied by the second white objects 302 can be expressed as follows:

$$S0 = M*(\pi/4)*D^2 = M*(\pi/4)*(X+\Delta D/2)^2 \quad (1),$$

$$S1 = M*(\pi/4)*(D-\Delta D)^2 = M*(\pi/4)(X-\Delta D/2)^2 \quad (2),$$

where X=D−ΔD/2.

The number of the conductive particles of M can be derived by combining formulas (1) and (2) to get:

$$S0 + S1 = M*(\pi/4)(X^2 + (\Delta D/2)^2) \quad (3).$$

Second, subtracting formula (2) from formula (1) to get:

$$S0 - S1 = M*\pi X \Delta D/2 \quad (4).$$

In normal circumstances, the reduced value ΔD is much less than the average diameter D, i.e., D is essentially equal to X. As such, formula (3) can be simplified as:

$$S0+S1=M*(\pi/2)X^2 \qquad (5).$$

By using formulas (4) and (5), the number of conductive particles M and the average diameter D can be expressed by S0, S1, and ΔD as follows:

$$M=2(S0-S1)^2/[\pi*\Delta D^{2}*(S0+S1)] \qquad (6),$$

$$D=X+\Delta D/2=\Delta D*(S0+S1)/(S0-S1)+\Delta D/2 \qquad (7).$$

In practice, the first area S0 can be calculated by the image processing device 804 by identifying the first white objects 202 in view of their digital values in the first binary image 20. The second area S1 can be calculated by the image processing device 804 by identifying the second white objects 302 in view of their digital values in the second binary image 30.

Furthermore, the Δ value is predetermined. Therefore, the number of the conductive particles of M can be calculated by the image processing device 804 according to the formula (6).

Referring to table 1, which lists a set of examples showing experimental results of calculating the number of conductive particles in the ACF 600. For example, an actual number of conductive particles contained in the ACF 600 may be 24, and the calculated number according to the above-described condition (6) is 24.58. The Error can be easily calculated to be 2.4%, which satisfies a predetermined quality requirement.

TABLE 1

Experimental result of calculating the number of conductive particles

| Actual Number | Calculated Number M | Error |
|---|---|---|
| 1 | 0.991 | 0.9% |
| 2 | 2.009 | 0.9% |
| 3 | 3.052 | 1.7% |
| 4 | 4.057 | 1.4% |
| 24 | 24.58 | 2.4% |

Figure 4:
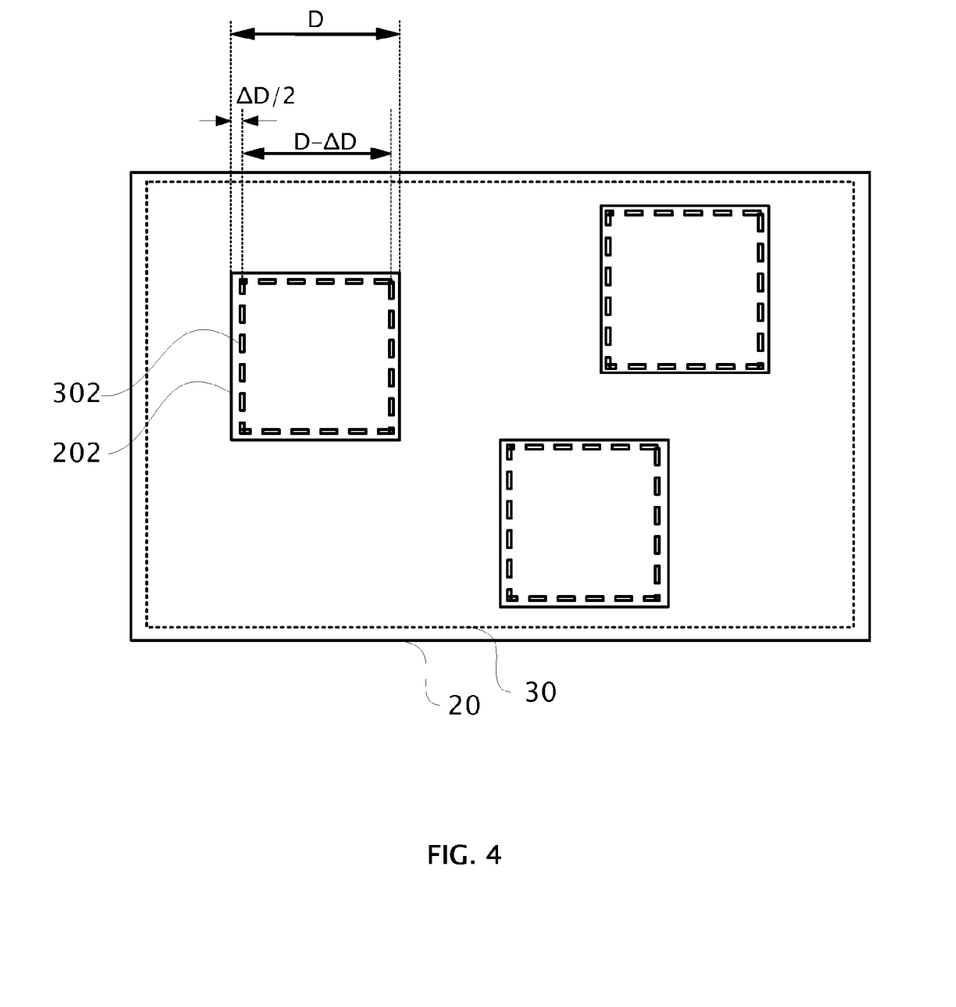
FIG. 4 is a schematic view illustrating a second type of conductive particles in the ACF.

Referring to FIG. 4, in a second embodiment, the first white objects 202 and the second white objects 302 representing the conductive particles have a generally square shape. Based on similar calculating processes as in the first embodiment, the number of conductive particles M can be calculated using the following formula:

$$M=2(S0-S1)^2/[\pi*\Delta D^2(S0+S1)] \qquad (8).$$

Figure 5:
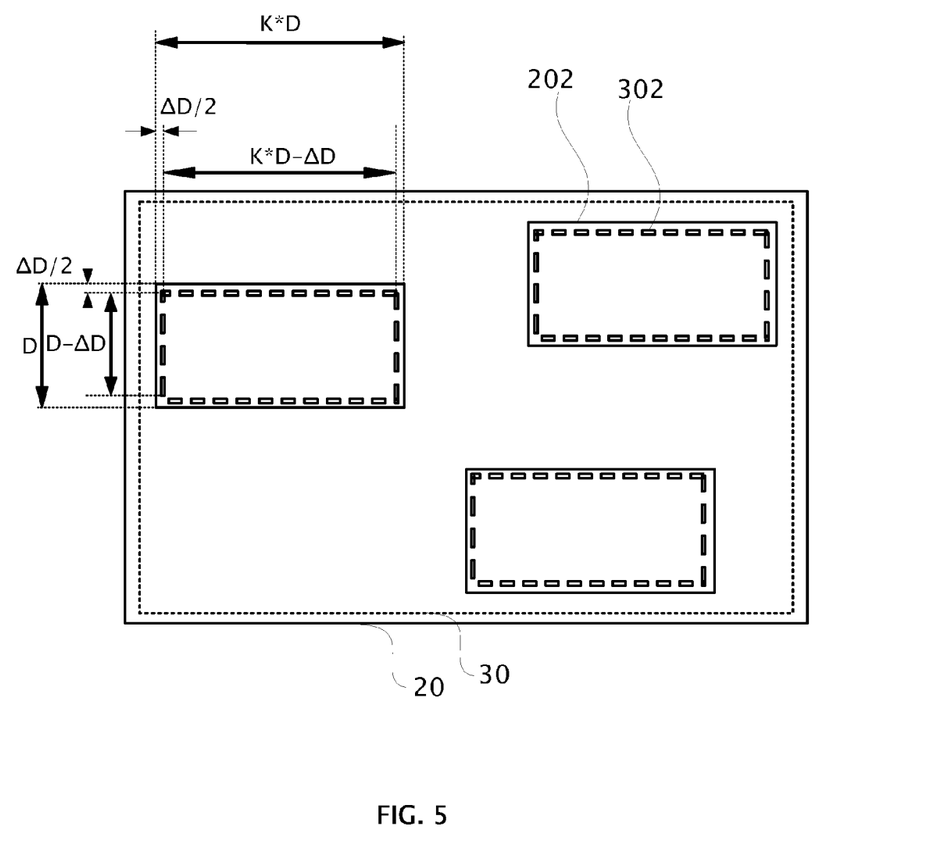
FIG. 5 is a schematic view illustrating a third type of conductive particles in the ACF.

Referring to FIG. 5, in a third embodiment, the first white objects 202 and second white objects 302 representing the conductive particles have a generally rectangular shape. Based on similar calculating process as in the first embodiment and the second embodiment, the number of the conductive particles M can be calculated using the following formula:

$$M=4k*(S0-S1)^2/[(k+1)^2*\Delta D^2*S0] \qquad (9),$$

where k is an aspect ratio of the rectangular first white objects 202 and second white objects 302 in the first binary image 20 and the second binary image 30 respectively.

After calculation, the value of the number of the conductive particles of M may be stored in the storage device 808 or displayed by the display device 806. The calculated number M is further used to determine the quality of the ACF 600.

It should be noted that in other embodiments, the imaging processing module 804 can process the first binary image 20 to generate the second binary image 30 in an enlarged version. The number of the conductive particles of M can be calculated from the first binary image 20 and the enlarged second binary image 30 according to a formula similar to the formula (6).

Figure 6:
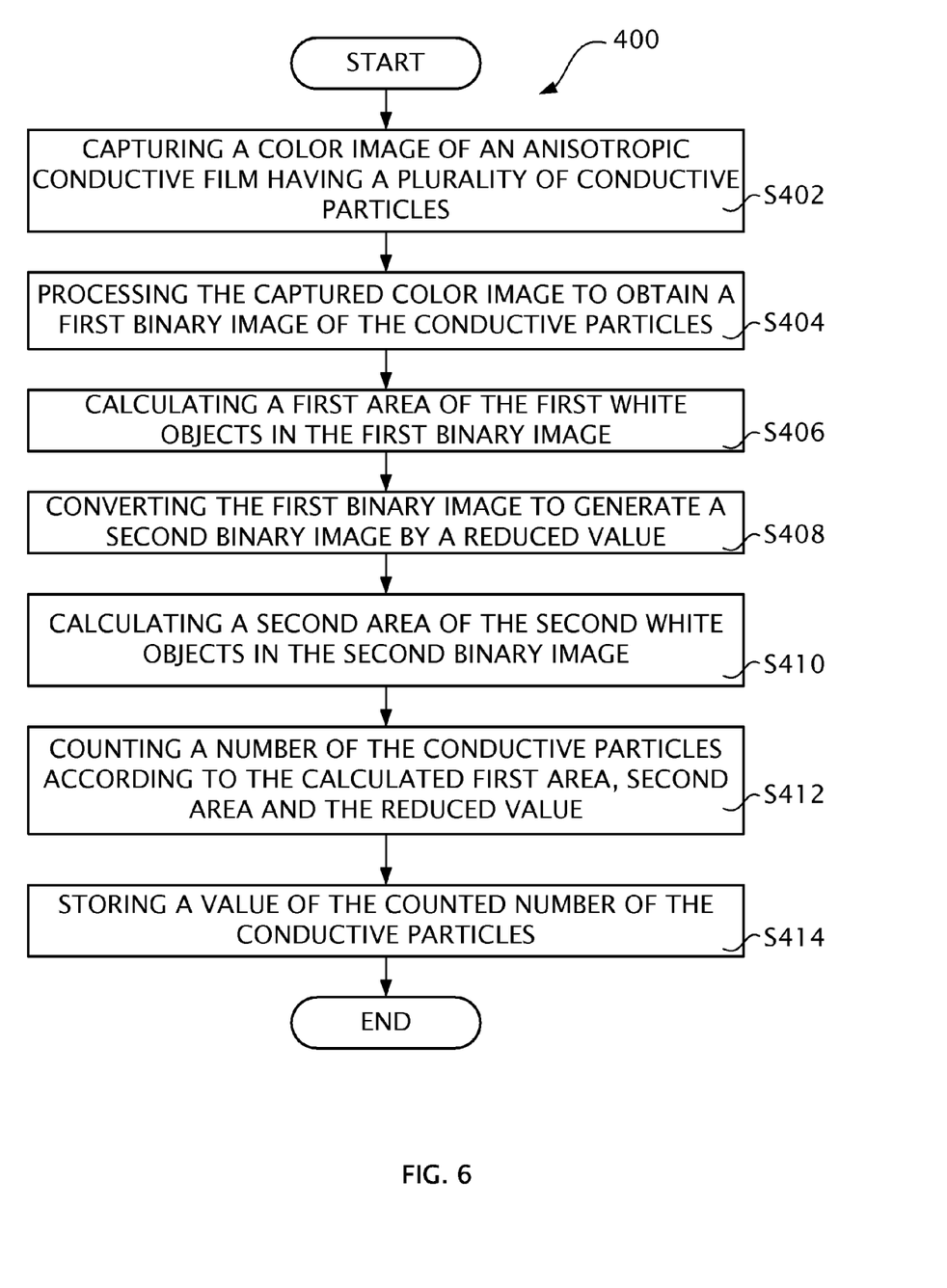
FIG. 6 is a flowchart illustrating various actions of a method for calculating the number of conductive particles dispersed in the ACF.

Referring to FIG. 6, a flow chart illustrating a method 400 for calculating a number of conductive particles dispersed in an ACF 600 is shown. The method 400 includes the following blocks, each of which is tied to various devices contained in the system 80 as shown in FIG. 1.

At block S402, the image capturing device 802 captures a color image 10 of the ACF 600 by processing electrical signals converted from image signals originated from the ACF 600.

At block S404, the image processing device 804 processes the captured color image 10 to generate a first binary image 20. The first binary image 20 includes a plurality of first white objects 202. The first white objects 202 correspond to the conductive particles dispersed in the ACF 600.

At block S406, the image processing device 804 calculates a first area S0 occupied by the white objects 202 in the first binary image 20.

At block S408, the image processing device 804 processes the first binary image 20, and reduces the first binary image 20 to generate a second binary image 30 by a predetermined reduced value ΔD, where Δ is the percent of reduction from the first binary image 20 to the second binary image 30. The second binary image 30 includes a plurality of second white objects 302 corresponding to each of the first white objects 202. In the embodiment, the second binary image 30 is a reduced version of the first binary image 20. In other embodiments, the second binary image 30 may be an enlarged version of the first binary image 20.

At block S410, the image processing device 804 calculates a second area S1 occupied by the plurality of second white objects 302 in the second binary image 30.

At block S412, the image processing device 804 calculates the number of the conductive particles of M according to one of the following formulas:

$$M=2SP*(N0-N1)^2/[\pi*\Delta D^{2}*(N0+N1)] \qquad (6),$$

$$M=2(S0-S1)^2/[\pi*\Delta D^2(S0+S1)] \qquad (8),$$

$$M=4k*(S0-S1)^2/[(k+1)^2*\Delta D^2*S0] \qquad (9).$$

where formula (6) may be chosen for calculating the first white objects 202 and the second white objects that are circular, formula (8) may be chosen for calculating the first white objects 202 and the second white objects that are square, and formula (9) may be chosen for calculating the first white objects 202 and the second white objects that are rectangular.

At block S414, the image processing device 804 causes the calculated number of the conductive particles of M to be stored in the storage device 808 or displayed by the display device 806.

It should be noted that the various blocks in the method 400 illustrated in FIG. 6 may be performed in the order presented, or may be performed in a different order.

For example, the block S406 and the block S408 can be exchanged in order. As such, at block S406, the image processing device 804 reduces the first binary image 20 to generate the second binary image 30. At block S408, the image processing device 804 calculates the first area S0 occupied by the plurality of first white objects 202 in the first binary image 20. In this case, the block S406 and the block S408 can be combined together, such that the image processing device 804 simultaneously calculates the first area S0 occupied by the plurality of first white objects 202 in the first binary image 20 and the second area S1 occupied by the plurality of second white objects 302 in the second binary image 30.

As described above, the system 80 and the method 400 employs an optical inspection technology to calculate the number of conductive particles dispersed in the ACF. By capturing an image of the ACF and processing the image of the ACF, the number of the conductive particles can be easily calculated. By determining the quality of the ACF according to the calculated number of conductive particles, the quality of the ACF can be determined reliably and accurately.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A system for determining a quality of an anisotropic conductive film, the anisotropic conductive film comprising conductive particles dispersed therein, the system comprising:
    an image capturing device configured to capture an image of the anisotropic conductive film; and
    an image processing device coupled to the image capturing device, the image processing device configured to process the image to generate a first binary image, the first binary image comprising a plurality of first objects representing the conductive particles, the first objects occupying a first area in the first binary image, the image processing device also configured to process the first binary image to generate a second binary image having a different size with respect to the first binary image by a predetermined value, the second binary image comprising a plurality of second objects corresponding to the plurality of first objects, the second objects occupying a second area in the second binary image, the image processing device further configured to calculate the number of the conductive particles according to the first area, the second area, and the predetermined value, thereby the quality of the anisotropic conductive film can be determined;
    wherein the image processing device is further configured to process the first binary image to generate the second binary image as a smaller version of the first binary image by a ratio determined by the predetermined value.

2. The system according to claim 1, wherein the image processing device is further configured to process the first binary image to generate the second binary image as a larger version of the first binary image by a ratio determined by the predetermined value.

3. The system according to claim 1, wherein the shapes of the first objects and second objects are circular, the image processing device further configured to calculate the number of the conductive particles according to a first formula of $M=2(S0-S1)^2/[\pi*\Delta D^2*(S0+S1)]$, where M is the number of the conductive particles, S0 is the first area of occupied by the plurality of first objects, S1 is the second area occupied by the plurality of second objects, $\Delta D$ is the predetermined value.

4. The system according to claim 1, wherein the shapes of the first objects and second objects are square, the image processing device is further configured to calculate a number of the conductive particles according to a second formula of $M=2(S0-S1)^2/[\pi*\Delta D^2(S0+S1)]$, where M is the number of the conductive particles, S0 is the first area occupied by the plurality of first objects, S1 is the second area occupied by the plurality of second objects, $\Delta D$ is the predetermined value.

5. The system according to claim 1, wherein the shape of the first objects and second objects are rectangular, the image processing device is further configured to calculate a number of the conductive particles according to a third formula of $M=4k*(S0-S1)^2/[(k+1)^2*\Delta D^2*S0]$, where M is the number of the conductive particles, S0 is the first area of occupied by the plurality of first objects, S1 is the second area occupied by the plurality of second objects, $\Delta D$ is the predetermined value, k is an aspect ratio of the rectangular first objects and second objects.

6. The system according to claim 1, further comprising:
    a display device coupled to the image processing device, the display device configured to display the color image, the first binary image and the second binary image.

7. The system according to claim 1, further comprising:
    a storage device coupled to the image processing device, the storage device configured to store the color image, the first binary image, and the second binary image according to predetermined formats, and the value of the calculated number of the conductive particles in the anisotropic conductive film.

8. A method of calculating the number of conductive particles dispersed in an anisotropic conductive film, the method comprising:
    capturing an image of the anisotropic conductive film by an image capturing device;
    processing the color image to generate a first binary image by an image processing device, the first binary image comprising a plurality of first objects representing the conductive particles dispersed in the anisotropic conductive film, the first objects occupying a first area in the first binary image;
    processing the first binary image to generate a second binary image having a different size with respect to the first binary image by a predetermined value determined by the image processing device, the second binary image comprising a plurality of second objects occupying a second area corresponding to the plurality of first objects; and
    calculating the number of the conductive particles dispersed in the anisotropic conductive film according to the first area, the second area, and the predetermined value.

9. The method according to claim 8, wherein the step of processing the first binary image to generate the second binary image by the image processing device comprises:
    processing the first binary image to generate the second binary image as a reduced version with respect to the first binary image by a ratio determined by the predetermined value.

10. The method according to claim 8, wherein the step of processing the first binary image to generate a second binary image by the image processing device comprises:
    processing the first binary image to generate the second binary image as a larger version with respect to the first binary image by a ratio determined by the predetermined value.

11. The method according to claim 8, wherein the step of calculating the number of the conductive particles dispersed in the anisotropic conductive film comprising:
    calculating the number of the conductive particles dispersed in the anisotropic conductive film according to a first formula of $M=2(S0-S1)^2/[\pi*\Delta D^2*(S0+S1)]$, where the shapes of the first objects and second objects are circular, M is the number of the conductive particles, S0 is the first area of occupied by the plurality of first objects, S1 is the second area occupied by the plurality of second objects, ΔD is the predetermined value.

12. The method according to claim 8, wherein the step of calculating the number of the conductive particles dispersed in the anisotropic conductive film comprising:
calculating the number of the conductive particles dispersed in the anisotropic conductive film according to a second formula of $M=2(S0-S1)^2/[\pi*\Delta D^2(S0+S1)]$, where the shapes of the first objects and second objects are square, M is the number of the conductive particles, S0 is the first area occupied by the plurality of first objects, S1 is the second area occupied by the plurality of second objects, ΔD is the predetermined value.

13. The method according to claim 12, wherein the step of calculating the number of the conductive particles dispersed in the anisotropic conductive film comprising:
calculating the number of the conductive particles dispersed in the anisotropic conductive film according to a third formula of $M=2(S0-S1)^2/[\pi*\Delta D^2(S0+S1)]$, where the shapes of the first objects and second objects are rectangular, M is the number of the conductive particles, S0 is the first area occupied by the plurality of first objects, S1 is the second area occupied by the plurality of second objects, ΔD is the predetermined value, k is an aspect ratio of the rectangular first objects and second objects.

14. The method according to claim 12, further comprising:
storing the image, the first binary image and the second binary image in a storage device; and
storing the calculated number of the conductive particles in the storage device.

15. The method according to claim 12, further comprising displaying the image, the first binary image and the second binary image in a display device.

16. A method of processing image of an anisotropic conductive film, the method comprising:
capturing a color image of the anisotropic conductive film by an image capturing device;
converting the captured color image to generate a first binary image by an image processing device, the first binary image comprising a plurality of first objects;
zooming the first binary image to generate a second binary image by a ratio determined by a predetermined value, the second binary image comprising a plurality of second objects having substantially a same shape but different size with respect to the corresponding plurality of first objects, the first objects occupying a first area in the first binary image, the plurality of second objects occupying a second area in the second binary image;
calculating the number of conductive particles dispersed in the anisotropic conductive film according to the first area, the second area, and the predetermined value; and
displaying the first binary image and the second binary image in a display device.

17. The method according to claim 16, wherein the plurality of first objects and the second objects are white objects appearing in a background portion of the first binary image.

18. The method according to claim 16, further comprising:
storing the color image, the first binary image and the second binary image in a storage device; and
storing a value of the calculated number of the conductive particles in the storage device.

* * * * *